United States Patent [19]

Carrico

[11] Patent Number: 4,682,565

[45] Date of Patent: Jul. 28, 1987

[54] VAPOR NOZZLE WITH GAS BARRIER BARS

[75] Inventor: Philip H. Carrico, Greenfield Center, N.Y.

[73] Assignee: SFE Technologies, San Fernando, Calif.

[21] Appl. No.: 820,572

[22] Filed: Jan. 16, 1986

Related U.S. Application Data

[63] Continuation of Ser. No. 672,529, Nov. 19, 1984, abandoned.

[51] Int. Cl.$^4$ .............................................. G23C 14/00
[52] U.S. Cl. ................................... 118/719; 118/718; 118/720; 118/721; 118/724; 118/726; 118/727; 118/729; 118/730; 239/290; 239/296; 239/299; 427/81; 427/286
[58] Field of Search ....................... 239/290, 296, 299; 118/720, 721, 718, 724, 726, 727, 730, 729, 719; 427/286, 81

[56] References Cited

U.S. PATENT DOCUMENTS

| | | | |
|---|---|---|---|
| 2,088,542 | 7/1937 | Westin | 118/320 X |
| 3,498,259 | 3/1970 | Braguier | 118/718 |
| 3,866,565 | 2/1975 | Ridout | 118/721 X |
| 4,301,765 | 11/1981 | Behn et al. | 118/718 |
| 4,423,956 | 1/1984 | Gordon | 118/718 X |
| 4,478,878 | 10/1984 | Neuwald | 118/721 X |

FOREIGN PATENT DOCUMENTS

| | | | |
|---|---|---|---|
| 642016 | 1/1979 | U.S.S.R. | 118/63 |
| 700624 | 11/1979 | U.S.S.R. | 239/290 |

*Primary Examiner*—Richard Bueker
*Attorney, Agent, or Firm*—Christie, Parker & Hale

[57] ABSTRACT

A vacuum vapor depositing system in which a plurality of vapor delivering nozzles fit between, and are guided by, bars supplying inert gas as barrier regions controlling the lateral spread of the vaporized material being deposited.

9 Claims, 6 Drawing Figures

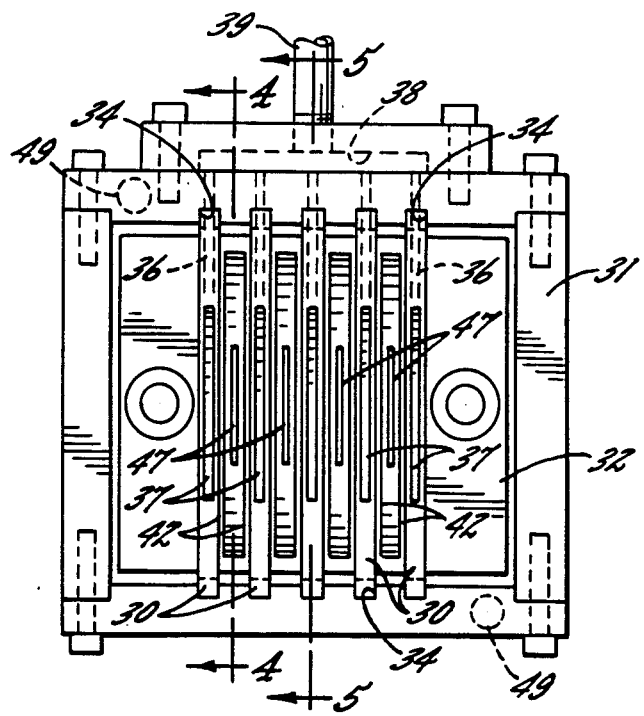
_fig. 3._
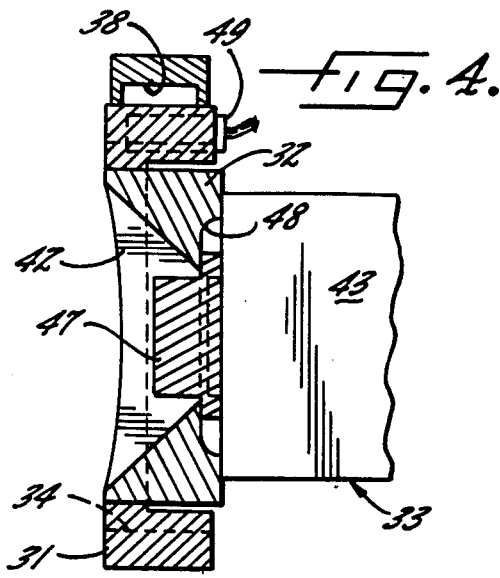
_fig. 4._
_fig. 5._
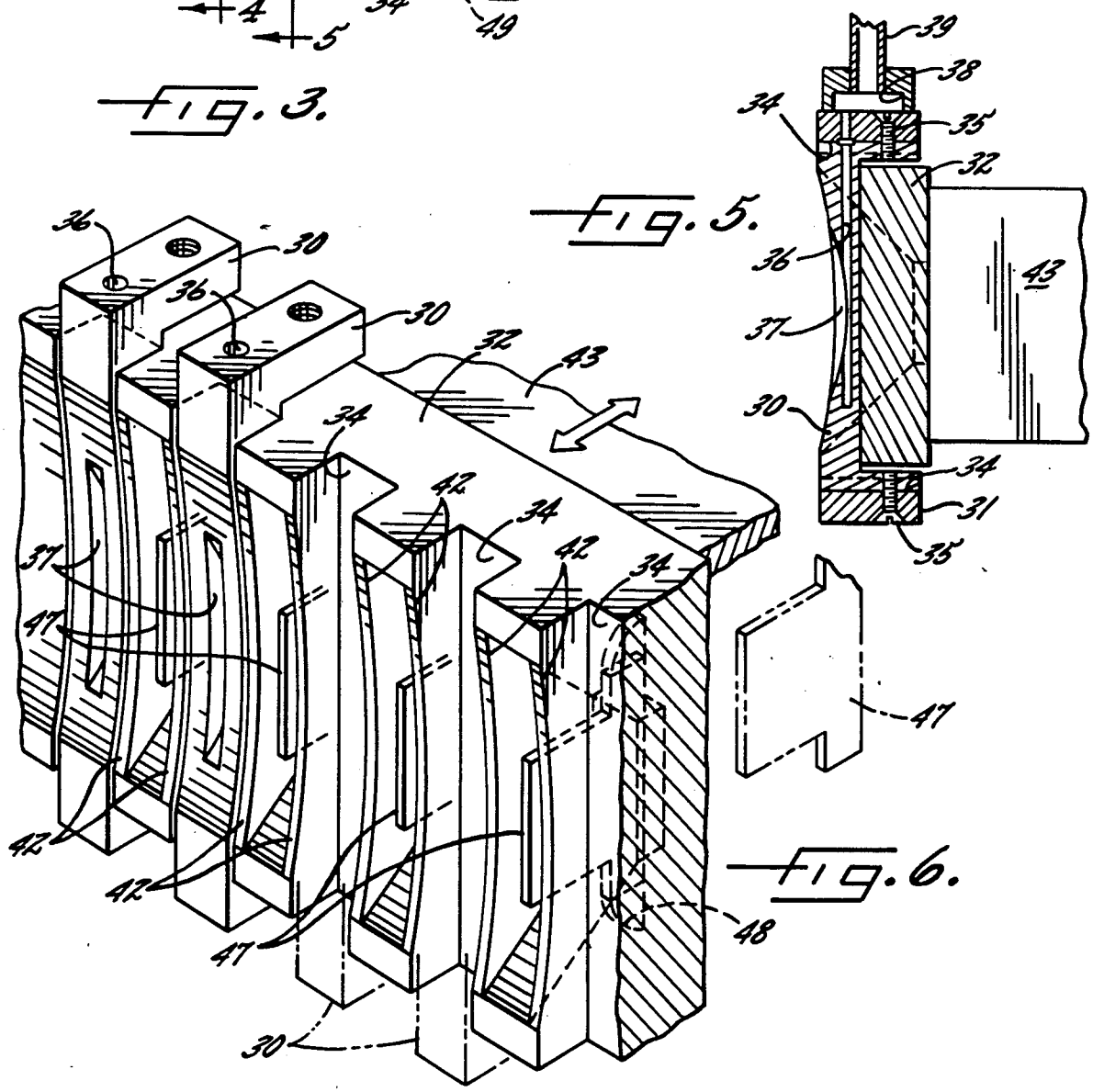
_fig. 6._

VAPOR NOZZLE WITH GAS BARRIER BARS

CROSS-REFERENCE TO RELATED APPLICATIONS

This is a continuation of application Ser. No. 672,529 filed Nov. 19, 1984, now abandoned.

This invention relates generally to vapor deposition and more particularly concerns apparatus for depositing a vaporized material on a surface in a defined line.

A method of manufacturing miniature monolithic electrical capacitors is shown in U.S. application Ser. No. 620,647, filed June 14, 1984, in which the dielectric portions of the capacitor are formed by vaporizing a monomer resin and depositing the resin in thin layers. The resin is thereafter cured. Proper dielectric layer formation in this manner requires even distribution of the resin, and the confining of that distribution to strict locations. This application presents problems in the very small dimensions involved. The dielectric layers are very thin, narrow strips; about 0.3 to 1 microns thick, and a few millimeters wide.

For manufacturing efficiency, a plurality of adjacent strips are deposited as adjacent lanes of capacitor structure are simultaneously made. Thus, the depositing structure must be multiple in nature.

It is an object of the invention to provide an improved nozzle structure that permits vapor deposition uniformly within very closely controlled dimensional limits. A related object is to provide a nozzle structure of this kind that can form a plurality of closely spaced deposited strips.

A further object is to provide a nozzle structure as characterized above that can deposit successive overlying layers, so that the deposit receiving surface is built up substantially, without losing the uniformity and control of each strip.

Other objects and advantages of the invention will become apparent upon reading the following detailed description, and upon reference to the drawings, in which:

FIG. 3 is an enlarged elevation taken approximately along the line 3—3 in FIG. 1;

FIGS. 4 and 5 are sections taken approximately along the lines 4—4 and 5—5, respectively, in FIG. 3; and FIG. 6 is a fragmentary perspective of a portion of the structure otherwise shown in FIG. 3.

While the invention will be described in connection with a preferred embodiment, it will be understood that I do not intend to limit the invention to that embodiment. On the contrary, I intend to cover all alternatives, modifications and equivalents as may be included within the spirit and scope of the invention as defined by the appended claims.

Figure 1:
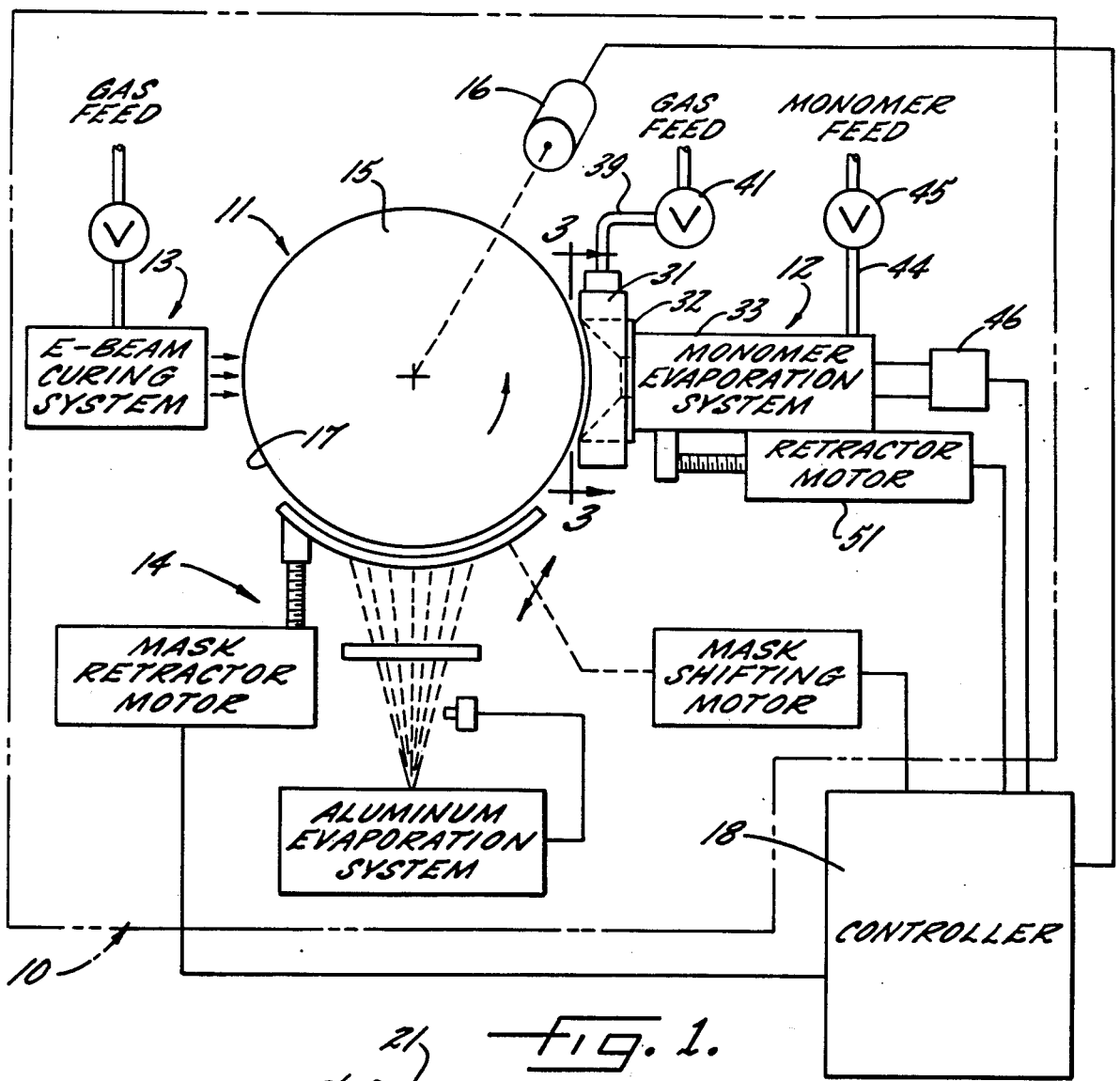
FIG. 1 is a schematic of the overall apparatus in which a system embodying the invention is utilized.
Figure 2:
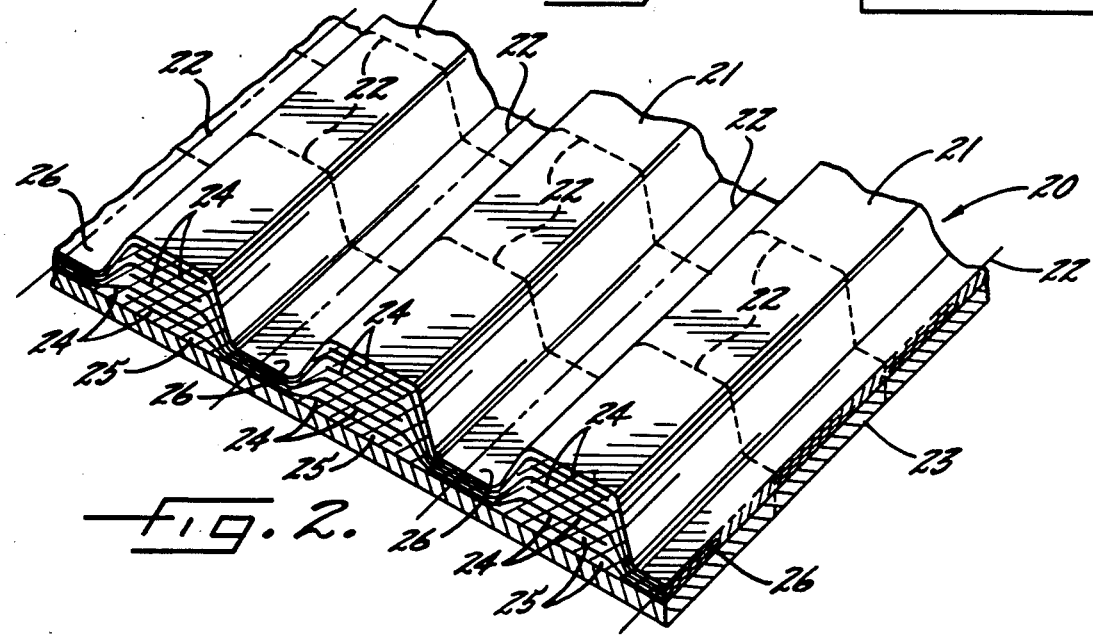
FIG. 2 is a fragmentary perspective of capacitor structure made by the apparatus of FIG. 1.

Turning to the drawings, there is shown in FIG. 1 a vacuum chamber 10 containing a carrier 11 around which is disposed apparatus including a dielectric depositing system 12 including the invention, a monomer curing system 13, and an electrode material depositing system 14. The carrier 11 is a water cooled drum 15 rotatably driven by a motor 16 and whose outer surface 17 therefore moves relatively to the systems 12, 13, 14. A controller 18 coordinates certain functions of the systems with the speed of the motor 16. During capacitor formation, the chamber is kept at a substantial vacuum, as low as $1 \times 10^{-4}$ Torr.

In operation, alternate layers of aluminum electrode material and curable resin dielectric are deposited toward the surface 17 carried by the drum 15 past the systems 12 and 14. Each coating of resin is cured by the system 13 after deposit. The procedure is repeated as the drum 15 rotates to build up the capacitor structure.

The apparatus forms capacitor sheets 20 having a plurality of lanes 21. Separating the sheet 20 along cutoff lines 22 forms individual capacitor bodies made up of a substrate 23, layers of electrode material 24 overlapping in a central capacitance region, and coatings 25 of dielectric separating the electrode layers 24. At either side of the capacitance region are terminal portions 26 where the electrode layers 24 are mechanically and electrically joined.

The layers 24 and coatings 25 are shown greatly exaggerated in size. In practice, the substrate is about 1.5-2 mils thick, the metal electrode layers 24 are only about 200-500 angstroms thick, and the dielectric coatings are from 0.3 to 1 micron thick. Within the total height of a few millimeters, thousands of electrode layer pairs can be formed.

The capacitor bodies, and the apparatus and methods for making them, are disclosed more completely in previously mentioned U.S. patent application Ser. No. 620,647, filed June 14, 1984, which is hereby specifically incorporated by reference.

In accordance with the invention, the dielectric deposition system 12 includes a plurality of gas barrier creating bars 30 fixed in a frame 31 and interfitted with a nozzle block 32 for controlling the flow of dielectric vapor from an evaporator 33. The frame 31 is rectangular and fixed within the chamber 10. The bars 30 fit within slots 34 in the frame 31 in parallel relation and are secured by screws 35. The faces of the bars 30 adjacent the drum surface 17 is curved to conform to the cylindrical drum 15, and the bars have internal passages 36 connected to elongated delivery openings 37 adjacent the surface 17. An inert gas such as Argon is delivered to the passages 36 from a chamber 38 fed by a line 39 and a valve 41.

The nozzle block 32 is formed with nozzle walls 42 closely fitted between the bars 30 and defining elongated openings facing the drum surface 17. The walls 42 are also curved to conform to the cylindrical drum surface. Vaporized monomer is delivered to the nozzle block 32 so as to be deposited through the nozzle walls 42 from the evaporator 33 which includes a heated evaporation tube 43 to which liquid monomer is fed by a line 44 through a valve 45. An ultrasonic device 46 is used in the evaporation system 12, and further details can be found in said application Ser. No. 620,647.

In order to prevent monomer condensation on the bar or nozzle structure, those elements are maintained at elevated temperatures above the condensation temperature of the monomer. The nozzle block 32 and its walls 42 are heated from direct, heat conduction contact with the evaporation tube 43. The bars 30 are heated by heating elements 49 mounted in the frame 31. It can be seen that the bars 30 are in good heat conductive contact with the frame 31.

To help stratify the flow of vaporized monomer through the nozzle walls 42, vanes 47 are fitted in slots 48 in the nozzle block 32 so that the vanes are held parallel to the nozzle walls. The vanes 47 promote an even flow of vaporized material from the tube 43 through the nozzle block. Although only one vane 47 is shown in each nozzle, a plurality of parallel vanes could be spaced within the nozzle walls 42 to increase the drag on the gas flow and further even out the flow of monomer.

Initially, both the bar openings 37 and the nozzle walls 42 are spaced quite closely from the drum surface 17, this spacing being on the order of 3-8 mils. As the capacitor structure is built up by depositing successive layers of electrode material separated by dielectric coatings, the nozzle block 32 and the evaporation tube 43 is stepped back by a retraction motor 51 so as to maintain the spacing of the nozzle walls 42 from the outermost capacitor layer. The motor 51 is operated by the controller 18 in accordance with the speed of the drum motor 16.

As noted above, a substantial vacuum is maintained in the chamber 10, and the evaporator 33 of the system 12 operates with a pressure in the tube 43 on the order of about 1 Torr, so that there is a considerable pressure differential urging the vapor through the nozzle walls 42. This flow is laterally controlled, however, by inert gas blocks created by a flow of Argon gas through the bar openings 37. An inert gas flow rate of about 1 cc/min is satisfactory. The bars 30 also fix the lateral location of the nozzle block 32 by closely confining and guiding the nozzle block as it is retracted.

It can now be seen that despite the small dimensions involved, the disclosed structure provides interfitting of various elements to achieve the desired results. Narrow bands of thin dielectric coating layers are applied to the drum surface 17, or more accurately to the substrate 23 secured to the surface 17, in narrow bands whose side edges are located by the gas barriers created by inert gas from the bars 30 so that there is only a side spread of vaporized material deposited approximately 1 millimeter toward either side of the nozzle walls 42.

I claim as my invention:

1. A nozzle structure for depositing vaporized material on a relatively moving surface comprising, in combination, a frame fixed with respect to said surface, a plurality of bars fixed on said frame in parallel relation so as to closely overlie said surface, said bars having internal passages and elongated delivery openings from said passages adjacent said surface, a nozzle block having nozzle walls closely fitted between said bars and defining elongated openings facing said surface, means for delivering vaporized material to said nozzle block for depositing material on said surface from said nozzle block openings, and means for delivering inert gas to said internal passages so that inert gas barrier regions are created on the sides of the material being deposited.

2. The combination of claim 1 in which said nozzle block is relatively movable with respect to said frame so as to vary the spacing of said nozzle block openings from said surface, said nozzle walls being slidable between said bars to permit said relative movement without varying the adjacent spacing of said bar openings and said nozzle block openings.

3. The combination of claim 1 including vanes within said nozzle block paralleling said nozzle walls to help stratify the flow of material through said nozzle block openings.

4. The combination of claim 1 including means for heating said nozzle block and said bars to prevent condensation of vaporized material on the block and bars.

5. A nozzle structure for depositing vaporized material on a relatively moving surface comprising, in combination, a frame fixed with respect to said surface, a plurality of bars fixed on said frame in parallel relation so as to closely overlie said surface, means for heating said bars, said bars having internal passages and elongated delivery openings from said passages adjacent said surface, a nozzle block having nozzle walls closely fitted between said bars and defining elongated openings facing said surface, said nozzle block being relatively movable with respect to said frame so as to vary the spacing of said nozzle block openings from said surface, means for delivering vaporized material to said nozzle block for depositing material on said surface from said nozzle block openings, vanes within said nozzle block paralleling said nozzle walls to help stratify the flow of material through said nozzle block openings, means for heating said nozzle block, walls and vanes, and means for delivering inert gas to said internal passages so that inert gas barrier regions are created on the sides of the material being deposited.

6. Apparatus for continuously producing under vacuum a monolithic multi-layer capacitor on a substrate surface comprising means for forming a layer of electrode material on a surface within a predefined electrode forming zone, means for forming a coating of dielectric material on a surface within a predefined dielectric forming zone, said means for forming a coating of dielectric material including a first nozzle closely overlying the substrate surface at said dielectric forming zone, and a pair of second nozzles adjacent either side of said first nozzle for creating an inert gas wall on either side of the dielectric forming zone, and means for repeatedly passing the substrate surface carrying said layers and coatings through the two zones in sequence so that two different portions of the surface are simultaneously within their respective zones so as to produce alternate layers and coatings of electrode and dielectric on the substrate surface.

7. An apparatus according to claim 6 including means for stepping said first nozzle away from said substrate surface after each repeated pass so as to maintain the first nozzle close but not in contact with said coatings.

8. An apparatus according to claim 6 including vanes within said first nozzle to help stratify the flow of dielectric material through said first nozzle.

9. An apparatus according to claim 6 including means for heating said first nozzle to avoid having dielectric material stick to said first nozzle.

* * * * *